United States Patent
Bessho et al.

[19]

[11] Patent Number: 5,880,540
[45] Date of Patent: Mar. 9, 1999

[54] SWITCHING APPARATUS WITH CURRENT LIMITING CIRCUIT

[75] Inventors: Yoshiyuki Bessho; Yuko Iwasaki; Norio Sone, all of Tokyo, Japan

[73] Assignee: Hewlett-Packard Company, Palo Alto, Calif.

[21] Appl. No.: 704,182

[22] Filed: Aug. 28, 1996

[30] Foreign Application Priority Data

Sep. 1, 1995 [JP] Japan .................................. 7-248375

[51] Int. Cl.$^6$ .................................................. G01R 31/26
[52] U.S. Cl. ........................ 307/131; 324/73.1; 324/765
[58] Field of Search ................................ 307/131, 125; 324/765, 73.1, 767; 371/25.1; 200/175

[56] References Cited

U.S. PATENT DOCUMENTS

| | | | |
|---|---|---|---|
| 4,215,309 | 7/1980 | Frey | 324/767 |
| 4,637,020 | 1/1987 | Schinabeck | 371/25.1 |
| 4,661,791 | 4/1987 | Wakasugi et al. | 355/151 |
| 4,818,934 | 4/1989 | Tamamura | 324/765 |
| 5,414,352 | 5/1995 | Tanase | 324/73.1 |
| 5,644,115 | 7/1997 | Knauer | 200/175 |

*Primary Examiner*—Jeffrey A. Gaffin
*Assistant Examiner*—Albert W. Paladini

[57] ABSTRACT

A signal switching apparatus performs precise and high speed measurements that indicate DUT breakdown. Several switching circuits having multiple signal switching apparatus provided in parallel with input terminals and output terminals. Each switching circuit is structured to have; (a) A first switch circuit which inputs the guard signal together with the low current measurement signal; (b) a current limiting circuit connected to a stress signal terminal on the input; (c) a second switch circuit connected on the input to the output of the current limiting circuit, having a guard terminal connected to the output of the first switch circuit; (d) A guarded line, one end of which is connected to the output terminals, and the other end of which is connected to the first switch circuit and the output of second switch circuit.

5 Claims, 5 Drawing Sheets

SWITCHING APPARATUS WITH CURRENT LIMITING CIRCUIT

FIELD OF THE INVENTION

The present invention relates to a switching circuit suitable for semiconductor device testing and, more precisely, to a switching apparatus for stress-test use on devices under test (hereafter referred to as "DUTs") and to a switching circuit used to switch between two signal sources.

BACKGROUND OF THE ART

The known method for measuring aging characteristics and overload characteristics (for example, breakdown characteristics due to apply stress signal to semiconductor dielectric layer stresses for a long time) is to apply stress signals (normally, signals above specific current and specific voltage levels) to several DUTs (transistors, integrated circuits, large-scale integrated circuits, and the like) of the same specification, for a long period of time (for example, 1,500 to 2,000 hours) continuously or intermittently, and to periodically detect current flowing through the DUTs.

Figure 4:
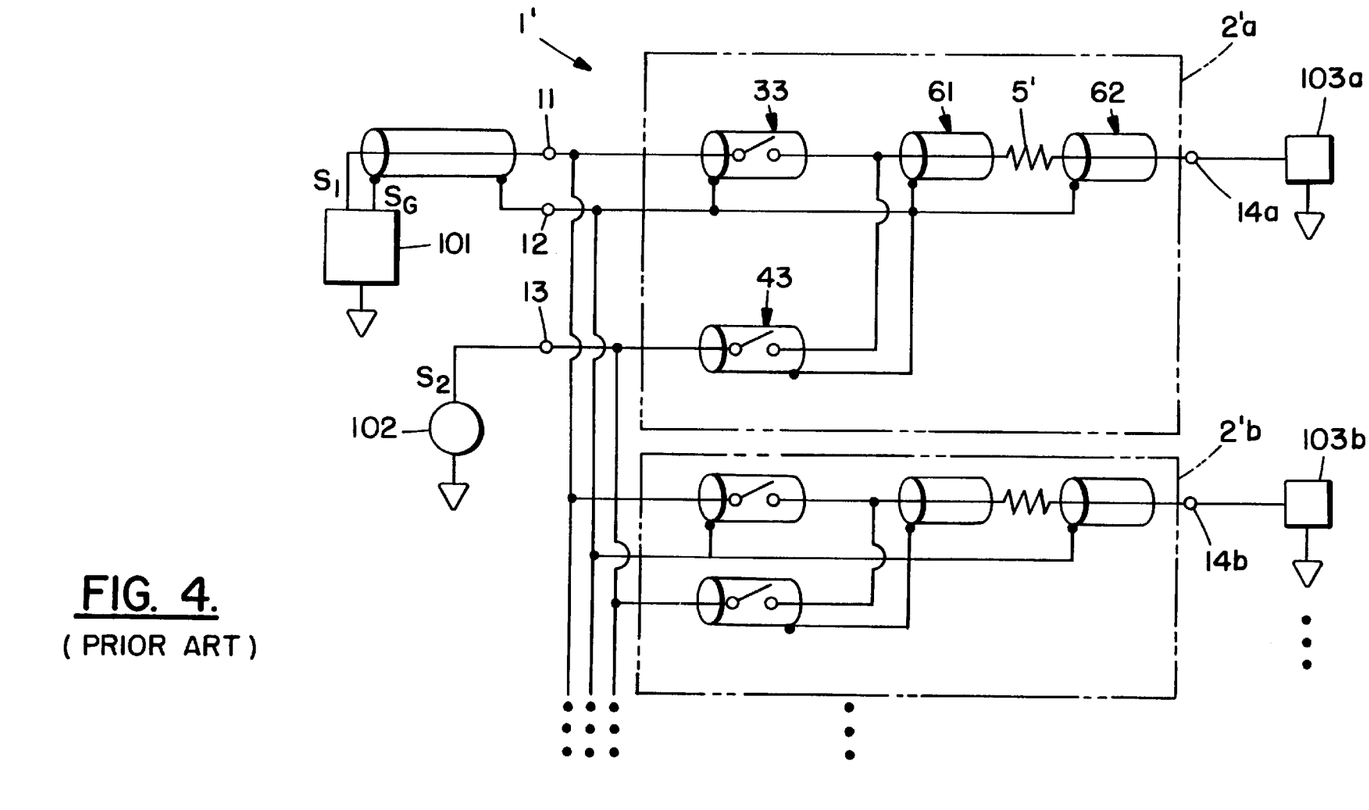
FIG. 4 is a drawing that shows a block diagram of a signal switching apparatus of the prior art.

FIG. 4 shows the structure of a prior art switching apparatus used to measure reliability. Switching apparatus 1' has measurement signal terminal 11 to which is inputted a low current measurement signal $S_1$ from a low current measurement device 101 (hereafter simply called, "measurement device"); a guard signal terminal 12 to which is inputted a guard signal $S_G$ from a measurement device 101; and input stress signal terminal 13 to which is inputted a stress signal $S_2$ from a stress signal source 102. Further, switching apparatus 1' has several DUT connection terminals 14a, 14b, etc. as output terminals to which are connected different DUTs 103a, 103b, etc., respectively.

As low current measurement device 101 may, for example, be a voltage/current measurement device that measures current flow through a DUT when voltage is added on the DUT from a constant-voltage source, and/or that measures the voltage across the DUT when current is caused to flow through the DUT from a constant-current source.

Switching apparatus 1' includes switching circuits 2'a, 2'b, etc., of identical structure between three common input terminals 11, 12 and 13 and respective output terminals 14a, 14b, etc. Each switching circuit comprises guarded switch 33, current limiting resistance (fixed resistance) 5', guarded lines 61, 62, and guarded switch 43 for stress signal.

Measurement signal terminal 11 is connected to the DUT connection terminal (14a in switching circuit 2'a) through guarded switch 33, guarded line 61, current limiting resistor 5', and guarded line 62 for each switching circuit. In addition to the connection to the guard conductor of guarded switch 33, guard signal terminal 12 is also connected to the guard conductor of guard connection lines 61 and 62. Input terminal 13 is connected to the output side of guarded switch 33 through guard conductor of guarded switch 43. The guard of guarded switch 43 is connected to the guard of guarded lines 61 and 62.

When a stress signal $S_2$ is applied by stress signal source 102, each guarded switch 33 of all switching circuits 2'a, 2'b, etc. is turned off and each guarded switch 43 is turned on, for all DUTs 103a, 103b, etc. In case a certain DUT is damaged by stress signal $S_2$, the potential often drops (to the ground potential in extreme cases) at the DUT connection terminal to which the DUT is connected. In such a case, current limiting resistance prevents not only the stress signal source 102 from being overloaded but also the supply current to the other undamaged DUTs from becoming insufficient.

In order to detect which DUT has broken down, the current flowing through each of the DUTs is measured by disconnecting each DUT from stress signal source 102 and connecting it to measurement device 101, one after another. For example, in the case of detecting whether DUT 103a has broken down or not, guarded switch 33 of only switching circuit 2'a alone is turned on, and guarded switch 43 of only this switching circuit 2'a is turned off. Alternatively, other DUTs 103b etc. may also be disconnected from the stress signal source by turning the other guarded switches 43 of switching circuits 2'b etc. other than switching circuit 2's. Low current measurement signal $S_1$ from measurement device 101 is applied to DUT 103a via switching circuit 2'a. Measurement device 101 then measures whether or not the current value of measurement signal $S_1$ exceeds the prescribed current value in order to detect whether DUT 103a has failed.

For the DUTs 103b etc., it is also possible to detect in which DUT circuit breakdown has occurred by sequentially switching the switches of the corresponding switching circuit 2'b, etc., to apply low current measurement signal $S_1$ thereto.

However, switching circuit 1' shown in FIG. 4 has the following problems.

(1) When low current measurement signal $S_1$ is to be applied for measuring, for example, DUT 103a with measurement device 101, it is not possible to apply to each DUT the suitable voltage that should properly be applied. In such a case, though one could make a compensation that took the above voltage drop into account, the required procedures for making such compensation would be complicated. In addition, this compensation may not be easy because there is variation in the resistance values of the current limiting resistances 5'. Furthermore, even if the resistance value of each current limiting resistance 5' were identified, influences of the change in temperature should also be considered, which would make the high precision measurement of low current by using conventional switching apparatus 1' difficult.

For this reason, it is not possible to use the above-described switching apparatus 1' to make a precise measurement over time in order to detect any precursor of breakdown of such DUTs.

Figure 5:
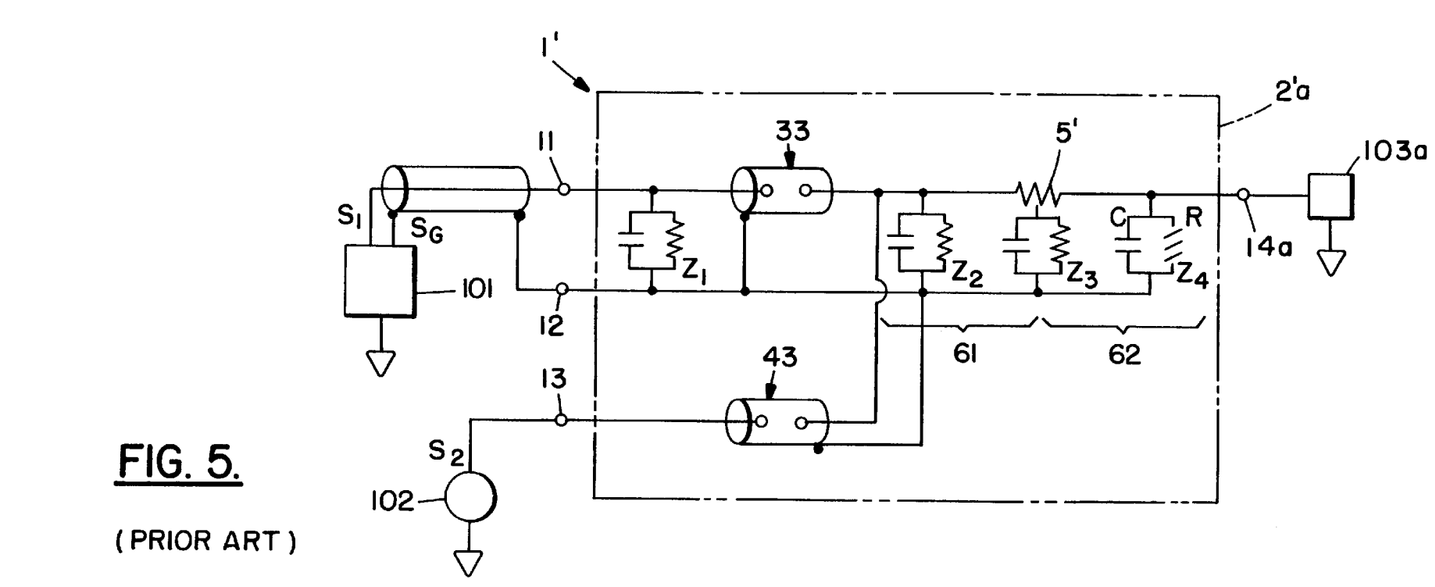
FIG. 5 is a drawing that shows an equivalent circuit of the prior art of FIG. 4.

(2) FIG. 5 shows the parasitic impedances $Z_1$, $Z_2$, $Z_3$ and $Z_4$ (RC parallel circuits) within the low current measurement signal path of switching circuit 2'a, between the guard and input terminal 11, the output terminal of guarded switch 33, current limiting resistance 5', and output terminal 14a. When measurement device 101 applies low current measurement signal $S_1$ to, for example, DUT 103a, the voltage across impedance $Z_4$ becomes large because of the voltage drop across current limiting resistance 5'. For this reason, leakage current flows through resistance (R) of impedance $Z_4$ and thus the current flowing through each DUT cannot be measured precisely. In a case where the resistance of impedance $Z_4$ is 1 giga-ohm and the voltage drop is 0.2 volt, the error current is as large as 0.2 nanoampere, making it substantially impossible to measure low current on the order of picoamperes.

(3) When switch 43 is turned on, the difference between the switching signal voltage and the guard signal voltage is applied to impedance $Z_4$. As a result, the potential difference between impedance $Z_4$ caused immediately after guarded switch 43 is turned off causes so-called dielectric absorption in the dielectric of impedance $Z_4$. Thus, the measurement should be postponed until the dielectric after-effect settles down after switch 43 is turned off and switch 33 is turned on for current measurement. In cases where the output of stress signal source 102 is 100 volts, it may take as long as tens of seconds for the current due to dielectric polarization to settle down to the order of femtoamperes. This will be a big problem for switching apparatus 1' of the prior art shown in FIG. 4.

(4) In order to resolve the above-described problems, it is desirable to utilize a current limiting circuit instead of current limiting resistance 5', in which the voltage drop does not depend on the current; as long as the current value does not exceed a prescribed value, the resistance value is zero ohms, but when it exceeds the prescribed value, the resistance value becomes infinite. Because such a current limiting circuit is made as a semiconductor device, leakage current tends to occur in the signal path. Thus, when this circuit is used for switching apparatus 1' of the prior art, the leakage current may adversely interfere with the low current measurement.

SUMMARY OF THE INVENTION

The object of the present invention is to provide a signal switching apparatus suitable for reliability measurement of DUTs which enables precise and high speed measurement of the DUT breakdown, its precursor or the like by eliminating the influence of the current limiting resistance introduced into the stress signal path.

Another object of the present invention is to make it possible to reduce manufacturing costs by devising an improved switching circuit of the stress signal path and the path of the signals used for low current measurement.

A further object of the present invention is to provide a circuit structure that can be utilized as a low-cost switch circuit; wherein signals from one of two signal sources connected to the guarded signal line through the switch circuit, and the switching circuit is turned off at the time so that a signal appears on the guarded signal line.

The switching circuit apparatus of the present invention has as input terminals: a measurement signal terminal to which are applied input low current measurement signals from a measurement device, a guard signal terminal to which are applied input guard signals from a measurement device, a stress signal terminal to which are applied input stress signals from a stress signal source. The apparatus also has as output terminals, a plurality of DUT connection terminals through which are output the stress signals or low current measurement signals to different DUTs. Furthermore, the switching apparatus has a switching circuit of identical structure between the three common input terminals and each of the output terminals.

Various types of signals can be used, such as DC current, DC voltage, AC current, AC voltage, which may be superimposed each other, or pulses that are used for low current measurement signals and stress signals. The stress signal source must supply stress signals simultaneously to a plurality of DUTS, while the measurement device may supply a low current measurement signal to only one DUT. The number of each of the stress signal source and the measurement device connected to the switching apparatus is not always one but may be plural. The voltage applied to the guard signal terminal normally is a value identical to the voltage applied to the measurement signal terminal. In addition to semiconductor devices such as large-scale integrated circuits and transistors, DUTs also include electrical components such as resistors and capacitors.

Basically, the switching circuit of the present invention applies identical stress to a plurality of DUTs of identical type, and is utilized to measure the effects caused by the stress over time. Accordingly, the DUTs connected to DUT terminals (output terminals) may be principally basically of identical type. However, different types of DUTs may be assigned to the output terminals for measurement. In such a case, different stress signal sources and different measurement devices may be used, depending on the type of DUT.

Each switching circuit has:

(a) A first switch circuit comprising
a guarded switch the input of which is connected to the measurement signal terminal, and
a guard switch the input of which is connected to the guard signal terminal and the guard of the guarded switch, the guard switch being linked to the guarded switch, (b) a current limiting circuit the input of which is connected to the stress signal terminal, (c) a second switch circuit with a guard terminal the input of which is connected to the output of the current limiting circuit and the output of which is connected to the output of the guarded switch of the first switch circuit, (d) a guarded line one end of which is connected to the output of the guarded switch of the first switch circuit and the other end of which is connected to the DUT connection terminal, the guard of the guarded line being connected to the output of the guard switch of the first switch circuit and to the guard terminal of the second switch circuit.

The second switch circuit may also comprises a single guarded switch, in which case the guard acts as the guard terminal of the switching circuit. Alternatively, the second switch circuit may ordinarily comprise two switches (one of these switches is a guarded one), as explained later with reference to FIGS. 1 and 2. Further, the second switch circuit is not limited to the structure explained later with reference to FIGS. 1 and 2, but may also comprise two mutually linked switches, one of the two switches being a guarded switch and the other being a switch for grounding one terminal of which is connected to the guard of the guarded switch and the other terminal of which is grounded.

Although reed relays are usually employed for the above mentioned switches in the present invention, the invention is not limited to such a configuration. In case guard is needed for the lines extending from the DUT connection terminals, a guard terminal may be provided that pairs with each DUT connection terminal.

In the present invention, a fixed resistance may be used for the current limiting circuit. Further, since the current limiting circuit is not involved in the low current measurement signal path, an electric circuit with leakage current (for example, a circuit comprising low priced active elements) may be employed as the current limiting circuit. The current limiting circuit may also comprise a current limiting value of which may vary. Since the current limiting circuit is not involved in the low current measurement signal path, it is possible to shorten the length of the guarded line composed of a coaxial cable, a pattern on the circuit board, etc., between the guarded switch of the first switch circuit and the DUT connection terminal.

The switching apparatus of the present invention operates as follows. When, for example, low current measurement signals are to be sent out to a DUT (i.e., on low current measurement), the first switch circuit of only one of switching circuits is turned on, while either the second switch circuit of this switching circuit is turned off or the second switch circuits of all the switching circuit are turned off. The measurement device measures the current value of the low current measurement signal with the precision of picoamperes or more so that the precursor of the breakdown of the DUT or the like may be detected.

On the other hand, when the low current measurement signals are not to be sent to any DUTs (i.e., on non low current measurement), the first switch circuits of all the switching circuits are turned off and the second switch circuits of all the switching circuits are turned on. The stress signals from the stress signal source are provided to each DUT via the current limiting circuit, the second switch circuit, and the guarded line. If a potential drop occurs at the DUT connection terminal due to the breakdown of the DUT connected to that terminal, the current limiting circuit prevents the stress signal source from being overload and shortage of the supply of the stress signal to the other DUTs from occurring.

In the switching apparatus of the present invention, the second switch circuit may comprise a guarded switch and a guard switch linked with the guarded switch, in which one end of the guard switch is connected to one end of the guarded switch and the other end of the guard switch is connected to the guard of the guarded switch, respectively. The two terminals of the guarded switch act respectively as the input and the output terminal of the second switch circuit, and the above mentioned other terminal of the guard switch acts as the output terminal of the second switch circuit.

In the switching apparatus of the present invention, the second switch circuit may alternatively comprise a series connection of a guarded switch and an input switch at its input terminal. The guard of the guarded switch is connected to the connection point of the guarded switch and the input switch at the input where the side of the input switch that is not connected to the guarded switch is the input side of the second switch circuit, and the side of the guarded switch that is not connected to the switch at the input is the output side of the second switch circuit. In addition, the guard of the guarded switch acts as the output terminal of the second switch circuit.

The switching circuit of the present invention is configured such that the output guarded switch and the switch at the input are connected in series and the guard of the output guarded switch connects to the connection point of the guarded switch and the switch at the input. This switching circuit is used to send a signal from a signal source connected to the input terminal of the switching circuit to an external device connected to the output terminal of the switching circuit when a force line and a guard line from another signal source are connected to the external device.

This switching circuit operates as follows. When the force signal and the guard signal from the above mentioned another signal source are applied on the force line and the guard line, both of the two switches are turned off. On the other hand, when the force signal and the guard signal from the source do not appear on the force line and the guard line, both of the two switches are turned on, if a signal from a signal source connected to the switch at the input is to be sent to the external devices.

In the switching circuit of the present invention, when the force signal and the guard signal from the above mentioned another signal source are applied on the force line and the guard line, that is, when both of the switch at the input and the output guarded switch are turned off, a switch with low insulation resistance may be used for the guarded switch at the output, because the potential between both terminals of the guarded switch at the output is very small, generally less than one millivolt.

DETAILED DESCRIPTION OF THE INVENTION

Figure 1:
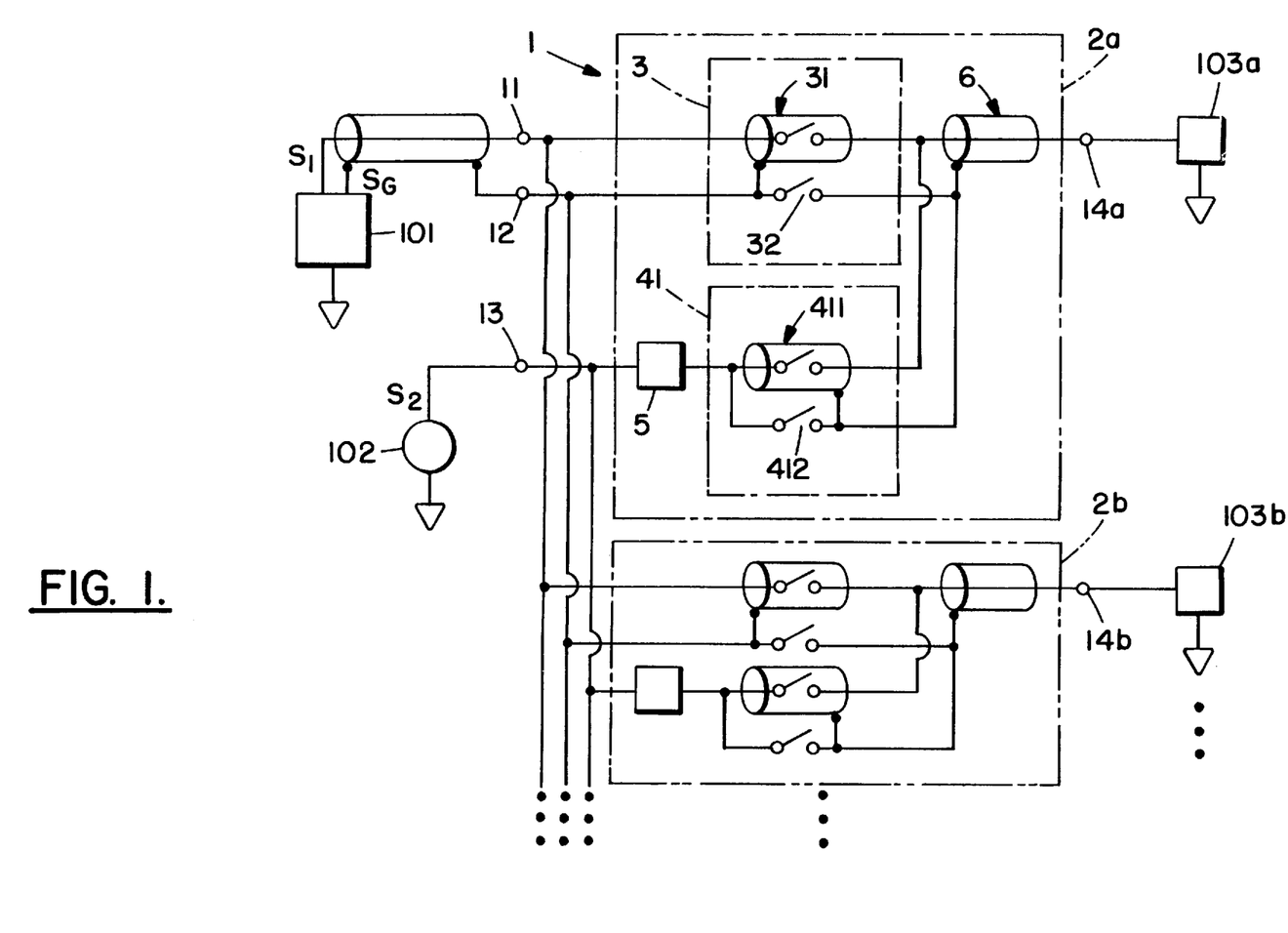
FIG. 1 is a drawing that shows a block diagram of one embodiment of the present invention.

FIG. 1 shows one embodiment of the invention in which signal switching apparatus 1 has three common terminals as input terminals: measurement signal terminal 11, guard signal terminal 12 and stress signal terminal 13; and has a plurality of DUT connection terminals, 14a, 14b, etc. as output terminals.

Measurement device 101 is connected to measurement terminal 11 and guard signal terminal 12 and outputs low current measurement signal $S_1$ and guard signal $S_G$ for measurement use. Stress signal source 102 (for example, a DC signal source) is connected to stress signal terminal 13 and outputs stress signal $S_2$. Also, each of DUT connection terminals 14a, 14b, etc. is connected to each of DUTs 103a, 103b, etc. of an identical type, basically.

Switching circuits 2a, 2b, etc., have identical structures and are connected between the three common input terminals 11, 12, 13 and each of output terminals 14a, 14b, etc. Each of switching circuits is structured to have first switch circuit 3, second switch circuit 41, current limiting circuit 5 and guarded line 6.

On the input side of each switching circuit, at first switch circuit 3, a force line of the guarded switch 31 is connected to the measurement signal terminal 11, and at the guard line is connected to the guard signal terminal 12 and guard of guarded switch 31. Guard switch 32 operates in linkage with guarded switch 31.

In the circuit of FIG. 1, current limiting circuit 5 is composed of an electronic circuit, and is connected on the input side to the stress signal terminal 13.

Second switch circuit 41 includes guarded switch 411 and a guard switch 412. One end of guard switch 412 is connected to one end of guarded switch 411 and the other end of guard switch 412 is connected to the guard of guarded switch 411. Further, in second switch circuit 41, both ends of guarded switch 411 become the input and output ends, and one end of guard switch 412 on which the end of guarded switch 411 is not connected becomes guard terminal.

Guarded line 6 is connected, to the output side of guarded switch 31 and the other end is connected to the DUT connection terminal (i.e., 14a in switching circuit 2a). The guard signal line is also connected to the output side of guard switch 32 and the output of guard switch 412 (more specifically, the guard terminal of second switch circuit 41). Although only DUT connection terminals 14a, 14b, etc. are provided as output terminals in FIG. 1, an output terminal for a guard connected to the guard of guarded line 6 may be provided in case a guard is needed in the neighborhood of DUT 103a, 103b, etc.,.

Refering in FIG. 1, since current limiting circuit 5 is located where there is no influence for the low current measurement signal, using electronic circuit components that have a leakage current other than a fixed resistance (a resistance element) for current limiting circuit 5 makes almost no influence on low current measurements. Also, it is possible to employ electronic structures in which the current limiting value can be varied externally.

For the switching apparatus in FIG. 1 when stress signal $S_2$ is sent to the DUT (on non low current measurement), the first switch circuit 3 of all switching circuits, 2a, 2b, etc., is turned off (more specifically, guarded switch 31 and guard switch 32 are turned off), and the second switch circuit 41 is turned on (more specifically, guarded switch 411 and guard switch 412 are turned on). The stress signal (for example, a DC voltage signal) $S_2$ is thus applied to DUT 103a, 103b, etc.

On switching apparatus in FIG. 1, when low current measurement signal $S_1$ is sent to the DUT (on low current measurement), any one of the first switch circuits, for example, the first switch circuit of switching circuit 2a alone, is turned on (more specifically, guarded switch 31 and guard switch 32 are turned on), and associated second switch circuit 41 of the switching circuit 2a is turned off (more specifically, guarded switch 411 and guard switch 412 are turned off). Thus measurement device 101 applies the low current measurement signal (for example, a DC voltage signal) $S_1$ to one of DUTs 103a, 103b, etc. and measures the response (i.e., current flowing in DUT 103a).

During the time that low current measurement signal $S_1$ is applied through switching circuit 2a to DUT 103a, it may be set each switching circuit 41 in all of the remained switching circuits 2b, etc. to turn on, or it may be set them to turn off. For example, when low current measurement signal $S_1$ and stress signal $S_2$ are at the same voltage level, each switching circuit 41 in the remained switching circuits 2b, etc. may be turned on. Furthermore, when low current measurement signal $S_1$ and stress signal $S_2$ are at different voltage level, each switching circuit 41 in the remained switching circuits 2b, etc. may be turned off.

Further, it does not matter whether low current measurement signal $S_1$ and stress signal $S_2$ have identical voltage values or not; each switching circuit 41 in the switching circuit 2b may be turned on or may also be turned off.

With the signal switching circuit of FIG. 1, since the current limiting circuit is not involved in the path of the low current measurement signal $S_1$. At the time of low current measurement, current flowing in DUT 103a, 103b, etc. can be measured with extremely high precision. Thus, precursors of DUT breakdown can be recognized. Also, when first switch circuit 3 is turned off and second switch circuit 41 is turned on, the voltage between the force line and the guard is substantially zero on any point of guarded line 6. Accordingly, for low current measurement, which is another way of saying that no dielectric absorption occurs, even when first switch circuit 3 is turned on and second switch circuit 41 is turned off, the low current measurement waiting time becomes substantially zero, thus making possible high-speed measurements.

On the signal switching circuit of FIG. 1, when the first switch circuit 3 is turned on and the second switch circuit 41 is turned off, the voltage of low current measurement signal source $S_1$ and the voltage of stress signal source $S_2$ are applied at each end of guarded switch 411. When the potential difference between each of both ends of guarded switch 411 is small, it is possible to use not so high insulation resistance switches for the guarded switch 411.

However, when the potential difference between the ends (contact points) of guarded switch 411 is large (when there is a large difference in the voltage values of low current measurement signal $S_1$ and stress signal $S_2$), switches having a large insulation resistance must be used for both guarded switch 411. Also leakage current occurs between the guard and the force line, on the locations between the input terminal of guarded switch 411 and the contact. Furthermore, charge current and dielectronic absorption current flow into the capacitance between the input portion of force line of guarded switch 411 and the guard of guarded switch 411.

Figure 2:
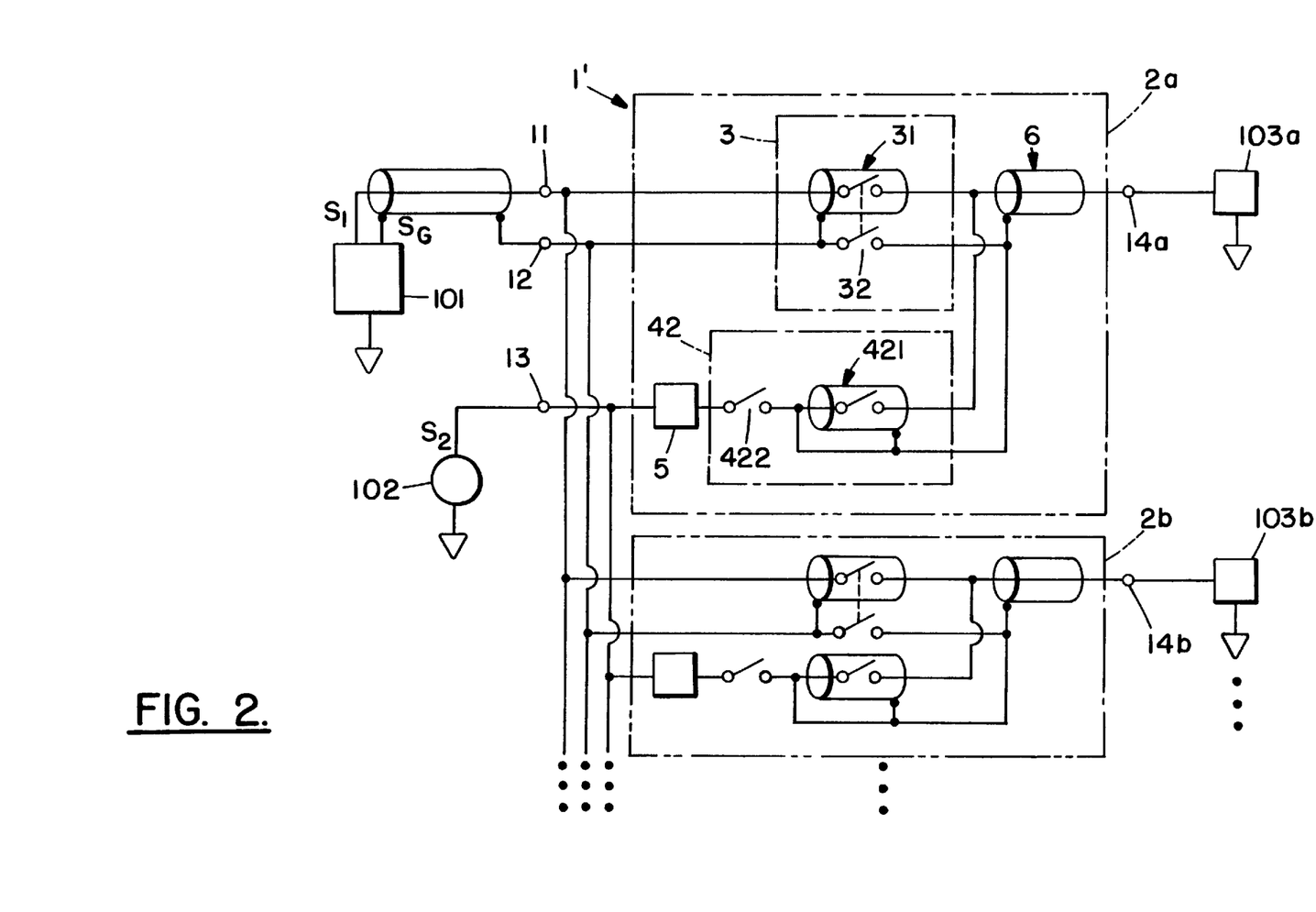
FIG. 2 is a drawing that shows a block diagram of another embodiment of the signal switching apparatus of the present invention.

When conditions such as these become problems, switching circuits 2a, 2b, etc., shown in FIG. 1, with switching circuits 2a, 2b, etc., shown in FIG. 2 can solve the problem. In FIG. 2 only the second switch circuit is different from that of FIG. 1.

Second switch circuit 42 in FIG. 2 shows guarded switch 421 and a input switch 422 linked to the guarded switch connected in series; the guard of the guarded switch 421 is formed by connecting the force signal line of guarded switch 421 to the connection point of input switch 422. Further, the output terminal of second switch circuit 42 is formed by the side of guarded switch 421 not connected to input switch 422; the input terminal is also formed by the side of guarded switch 421 not connected to input switch 422; further, the guard of guarded switch 421 forms the guard terminal of switching circuit 42.

At switching circuit 1 in FIG. 2, first switch circuit 3 and second switch circuit 42 are turned off and on with same manner as in FIG. 1 for both cases of low current measurement and non low current measurement.

With the second switch circuit shown in FIG. 2, at the time when a low current is measured (more specifically, when guarded switch 31 and guard switch 32 are on, and guarded switch 421 and input switch 422 are off), the potential difference between both terminals of guarded switch 421 becomes equal to the potential difference between low current measurement signal $S_1$ and the guard signal $S_G$. Accordingly, it is not necessary to use a high insulation element for guarded switch 421. It is possible to use a lower priced element than the guarded switch 411 shown in FIG. 1.

With the second switch circuit shown in FIG. 1, if there is a 100-volt potential difference between both terminals of switch 411 when guarded switch 411 is turned off, it is necessary to use an element having an isolation resistance of $10^{14}$ ohms with aiming for a design leakage current of one picoampere. By comparison, when the second switch circuit 42 shown in FIG. 2 is used, and aiming for a design leakage current of one picoampere, when a voltage of 1 millivolt appears between the force signal line and the guard of guarded switch 421, only $10^9$ ohms are required as insulation resistance.

Furthermore, with second switch circuit 42 shown in FIG. 2, since the potential difference is almost zero between the force line and the guard line at the location between input of guarded switch 421 and the contact, it occurs no leakage current, no charge current and no dielectronic absorption current in contrast to the above-mentioned case of guarded switch 411 of second switch circuit 41 in FIG. 1. Thus, it becomes possible to make even more precise and higher-speed low current measurements.

In switching apparatus 1 shown in FIG. 2, in the same way as for the switching apparatus shown in FIG. 1, during the time applying the low current measurement signal via switching circuit 2a to DUT 103a, it is possible to set each second switch circuit 41 of all the remained switching circuits 2b, etc. to turn off.

In this case, it is possible to set each second switch circuit 41 to turn off with either of the following manners:
(1) guarded switch 421 and input switch 422 are both turned off;
(2) guarded switch 421 is turned on, and input switch 422 is turned off.

Under manner (1), the guard of guarded line 6 of switching circuit 2b is connected neither to the DUT nor the measurement device 101, and the guard has a floating potential. This floating guard causes to have a capacitance between other lines, and a equivalent connection with large resistance between the guard and other lines. Accordingly, when measuring a low current, influence of the capacitance and large resistance may appear to measurement circuit and thus it is possible that measurement precision will decrease.

On the other hand, under manner (2), since the potentials of guarded line 6 and the guard become to be equal, the problem of manner (1) do not occur. Thus, normally, switching is done by manner (2) at second switch circuit 42.

The structure of the switching circuit of the present invention includes the structure of the second switch circuit shown in FIG. 2, which is also suitable for applications other than reliability measurements of low current measurements.

Figure 3:
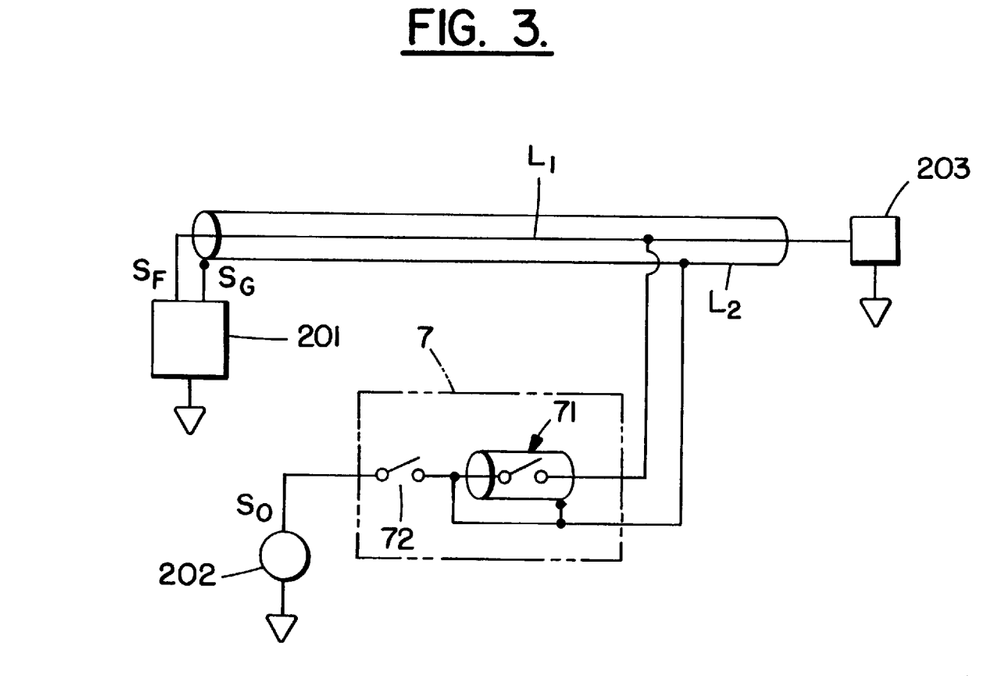
FIG. 3 is a drawing that shows a block diagram of one embodiment of the switching circuit of the present invention.

The switching circuit of the present invention is also shown in FIG. 3. Here, switching circuit 7 is configured with an input switch (normally without guard) 72, and a guarded switch 71, connected in series. Switching circuit 7 is used in case of force line $L_1$ and guard line $L_2$ from another signal source 201 connected to external device 203 on the output side, and signal $S_0$ is sent from signal source 202 to external device 203.

With switching circuit 7, the output side of the output guarded switch 71 and its guard are respectively connected to force line $L_1$ and guard line $L_2$. Also, the guard of the output guarded switch 71 is connected to the input of guarded switch 71.

When force signal $S_F$ and guard signal $S_G$ from above-described another signal source 201 are appeared on force line $L_1$ and guard line $L_2$, respectively, both of input switch 72 and the switch of output guarded switch 71 are turned off.

Also, when force signal $S_F$ and guard signal $S_G$ from above-described another signal source 201 are not appeared on force line $L_1$ and guard line $L_2$, respectively, and signal $S_O$ from signal source 201 is outputted to external device 203, both of input switch 72 and the switch of output guarded switch 71 are turned on.

With this switching circuit, when force signal $S_F$ and guard signal $S_G$ from signal source 201 are appeared on force line $L_1$ and guard line $L_2$, respectively, more specifically, when both of input switch 72 and guarded switch 71 are turned on, the potential difference between the force line of guarded switch 71 and the guard is extremely small and less than approximately one millivolt.

Accordingly, similar to the explanation of second switch circuit 42 of FIG. 2, an element with a small insulation value can be used as the guarded switch 71; moreover, leakage current will be small between the force line and the guard at the location between input of guarded switch 71 and the contact, thus there is no dielectronic absorption between them.

It is clear to those skilled in the art that the above examples of the present invention do not limit the invention merely to the illustrations. Especially, by connecting a plurality of stress signal sources or a plurality of low current measurement devices to the switching circuit of the present invention, those skilled in the art can easily see that making adjustments and changes is easy to do.

The switching circuit of the present invention, using the above structure, can produce the following types of effects:

(1) Since the current limiting circuit is not involved in the low current measurement signal path, the error current becomes extremely small, and it becomes possible to make high precision measurements on the order of femtoamperes.

(2) On the whole length of guarded lines of the low current measurement signal path, high-speed measurement becomes possible because no voltage drop occurs which substantially causes no dielectric absorption, so-called.

(3) Because rarely the low current measurement signal receives interference from the current limiting circuit, or it receives none at all, the current limiting circuit can be more freely selected. Accordingly, for the current limiting circuit, it is possible to select components comprised of semiconductor devices in which the current limiting values can be changed.

(4) Notwithstanding the fact that it has the above effects, the manufacturing cost of the apparatus of the invention rivals that of the prior art.

Also, because the switch circuit of the present invention is structured as described above, it is possible to produce low-cost switch circuits having extremely small leakage current for two signal sources.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A signal switching apparatus for switching signals from a measurement device and a stress signal source to a plurality of devices under test, comprising:
   a plurality of common input terminals including a measurement signal terminal applying current measurement signals from the measurement device, a guard signal terminal applying guard signals from the measurement device, a stress signal terminal applying stress signals from the stress signal source;
   a plurality of output terminals connected to DUTs, outputting the stress signals or the measurement signals to different DUTS;
   a plurality of switching circuits connected between the common input terminals and each of the output terminals, each switching circuit further comprising
   (a) a first switching circuit including a guarded switch and a guard switch, an input of said guarded switch being connected to the measurement signal terminal, an input of said guard switch being connected to the guard signal terminal and a guard of the guarded switch, the guarded switch being linked to the guarded switch;
   (b) a current limiting circuit, an input of said current limiting circuit being connected to the stress signal terminal;
   (c) a second switching circuit with a guard terminal, an input of said second switching circuit being connected to the output of the current limiting circuit, an output of said second switching circuit being connected to an output of the guarded switch of the first switch circuit; and (d) a guarded line, one end of said the guarded line being connected to an output of the guarded switch of the first switching circuit, the other end of said guarded line being connected to the output terminal, a guard of the guarded line being connected to the output of the guard switch of the first switching circuit and to the guard terminal of the second switching circuit.

2. A signal switching apparatus as described in claim 1, wherein the second switch circuit further comprises:

a guarded switch, an input of said guarded switch being connected to the input of the second switching circuit, an output of said guarded switch being connected to the output of the second switching circuit; and a guard switch, an input of said guard switch being connected to the input of the guarded switch of the second switching circuit, an output of said guard switch being connected to the output of the second switch circuit and a guard of the guarded switch.

3. A signal switching apparatus as described in claim 1, wherein the second switching circuit further comprises:

an input switch, an input of said input switch being connected to the input of the second switching circuit; and a guarded switch, an input of said guarded switch being connected to the output of the input switch, an output of said guarded switch being connected to the output of the second switching circuit, a guard of said guarded switch being connected to the input of the guarded switch and the output of the second switching circuit.

4. A signal switching apparatus as described in claim 1 wherein the current limiting circuit comprises a current limiting value that can be varied.

5. A switching circuit for switching a signal from a first signal source with a signal output to an external device, said external device connected to a second signal source with a force line and a guard line, comprising:

an input switch, an input of said input switch being connected to the signal output of the first signal source; and a guarded switch, an input of said guarded switch being connected to the output of the input switch, an output of said guarded switch being connected to the force line, a guard of said guarded switch being connected to the input of the guarded switch and the guard line.

* * * * *

UNITED STATES PATENT AND TRADEMARK OFFICE
CERTIFICATE OF CORRECTION

PATENT NO. : 5,880,540

DATED : March 9, 1999

INVENTOR(S) : Bessho, et al

It is certified that error appears in the above-identified patent and that said Letters Patent is hereby corrected as shown below:

Claim 1, column 10, line 60, "switch, the guarded switch being linked to the" should read ---- switch, the guard switch being linked to the ----.

Signed and Sealed this

Eighth Day of May, 2001

Attest:

NICHOLAS P. GODICI

Attesting Officer     Acting Director of the United States Patent and Trademark Office